United States Patent
Kim et al.

(10) Patent No.: US 7,071,613 B2
(45) Date of Patent: Jul. 4, 2006

(54) ORGANIC ELECTROLUMINESCENT DEVICE

(75) Inventors: Ock Hee Kim, Gyeonggi-do (KR); Tae Joon Ahn, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 220 days.

(21) Appl. No.: 10/133,323

(22) Filed: Apr. 29, 2002

(65) Prior Publication Data

US 2003/0067266 A1   Apr. 10, 2003

(30) Foreign Application Priority Data

Oct. 10, 2001   (KR)   ................. 2001-62307
Nov. 5, 2001    (KR)   ................. 2001-68485

(51) Int. Cl.
*H05B 33/00* (2006.01)
(52) U.S. Cl. ........................ 313/504; 313/506
(58) Field of Classification Search ............... 313/498, 313/501–512, 311, 110, 111; 428/690, 917, 428/212; 315/169.3; 174/35 MS, 35 R; 445/23–25
See application file for complete search history.

(56) References Cited

U.S. PATENT DOCUMENTS

| | | | |
|---|---|---|---|
| 5,049,780 A * | 9/1991 | Dobrowolski et al. ...... 313/509 |
| 5,153,481 A | 10/1992 | Matsuda et al. |
| 5,707,745 A * | 1/1998 | Forrest et al. ............... 428/432 |
| 5,923,464 A * | 7/1999 | Braun ......................... 359/350 |
| 6,281,552 B1 * | 8/2001 | Kawasaki et al. ........... 257/350 |
| 6,387,517 B1 * | 5/2002 | Belleville et al. ........... 428/447 |
| 6,388,377 B1 * | 5/2002 | Kobayashi et al. ......... 313/505 |
| 6,515,428 B1 * | 2/2003 | Yeh et al. ................. 315/169.3 |
| 6,538,390 B1 * | 3/2003 | Fujita et al. ............. 315/169.3 |
| 6,624,571 B1 | 9/2003 | Toyoyasu et al. |
| 6,774,574 B1 * | 8/2004 | Koyama .................. 315/169.3 |
| 2002/0180350 A1 * | 12/2002 | Furugori et al. ............ 313/506 |

FOREIGN PATENT DOCUMENTS

| | | |
|---|---|---|
| KR | 1994-0007442 | 8/1994 |
| KR | 2001-0023412 | 3/2001 |

* cited by examiner

*Primary Examiner*—Joseph Williams

(74) *Attorney, Agent, or Firm*—Morgan, Lewis & Bockius, LLP

(57) ABSTRACT

An organic electroluminescent device provides reduced reflectivity to increase contrast and improve display quality. The organic electroluminescent device includes a substrate, a first electrode over the substrate, at least one organic electroluminescent layer on the first electrode, a second electrode of a transparent conductive material on the at least one organic electroluminescent layer, a top passivation layer on the second electrode, and a compensation layer including at least an antireflection coating material or an antiglare coating material.

28 Claims, 9 Drawing Sheets

ORGANIC ELECTROLUMINESCENT DEVICE

The present application claims the benefit of Korean Patent Application Nos. 2001-62307 and 2001-68485 filed on Oct. 10, 2001 and on Nov. 5, 2001, respectively, in Korea, which are both hereby incorporated by reference.

BACKGROUND OF THE INVENTION

1. Field of the Invention

The present invention relates to organic electroluminescent devices, and more particularly, to a top emission type organic electroluminescent device.

2. Discussion of the Related Art

Flat panel display devices—which are characterized as being thin, light weight and energy efficient—are in high demand in the display field as the information age rapidly evolves. Flat panel display devices may be classified into two types depending on whether it emits or receives light. One type is a light-emitting type display device that emits light to display images, and the other type is a light-receiving type display device that uses an external light source to display images. Plasma display panels, field emission display devices, and electroluminescence display devices are examples of the light-emitting type display devices. Liquid crystal displays are examples of the light-receiving type display device.

Among the flat panel display devices, liquid crystal display (LCD) devices are widely used for laptop computers and desktop monitors because of their superiority in resolution, color image display and image quality. However, since the LCD device is the light-receiving type display device, it has some disadvantages such as poor contrast ratio, narrow viewing angle, and difficulty in enlarging its size. Therefore, new types of flat panel display need to be researched and developed to overcome the aforementioned disadvantages.

Recently, organic electroluminescent display devices have been of the most interest in research and development because they are light-emitting type displays having a wide viewing angle and a good contrast ratio as compared to the LCD device. Since the organic electroluminescent device is a light-emitting type display device, it does not require a backlight device and can be light weight and thin. Further, the organic electroluminescent display device has low power consumption. When driving the organic electroluminescent display device, a low voltage direct current can be used, and a rapid response speed can be obtained. As widely known, since the organic electroluminescent display device is totally solid phase unlike the LCD device, it is sufficiently strong to withstand external impacts and has a greater temperature range. Additionally, the organic electroluminescent device can be manufactured at a low cost. Moreover, since only the deposition and encapsulation apparatuses are necessary in a process of manufacturing the organic electroluminescent display device, process management can be simplified, and suitable procedures can be achieved.

As an operating method for the organic electroluminescent display device, a passive matrix operating method not using thin film transistors is conventionally utilized. In this type of organic electroluminescent display device, scanning lines and signal lines, which are arranged in a matrix pattern, perpendicularly cross each other. The scanning voltage is sequentially applied to the scanning lines to operate each pixel. To obtain the required average luminance, the instantaneous luminance of each pixel during the selection periods is intensified by multiplying the average luminance by the number of scanning line.

However, as another method of operating the organic electroluminescent display device, an active matrix operating method that is free from the above-described problems is proposed. The active matrix type organic electroluminescent display device usually includes thin film transistors pairs which confer a voltage storing capability on the pixels. Each of the pairs of thin film transistors has a selection transistor and a drive transistor. The selection transistor is connected to a signal line for supplying a data signal and a scanning line for supplying a gate signal. The drive transistor is connected to the selection transistor and a constant voltage line. In the structure of active matrix type organic electroluminescent display device, a voltage applied to the pixels is stored in storage capacitors, thereby maintaining the signals until the next period of applying the voltage. As a result, a substantially constant current flows through the pixels, and the organic electroluminescent display device emits light at a substantially constant luminance during one frame period. With the active matrix type, because a low current is applied to the pixel, it is possible to enlarge the display device, thereby forming much finer patterns and obtaining a much lower power consumption due to the constant luminance.

The driving principle of the display apparatus according to the conventional art will now be described. FIG. 1 is an equivalent circuit diagram which specifically shows the structural basis of pixels of the active matrix type organic electroluminescent display device.

As shown in FIG. 1, scanning lines are arranged in a transverse direction, and signal lines are arranged in a longitudinal direction perpendicular to the scanning lines. A voltage line that is connected to a power supply to provide a voltage to drive transistors is also disposed in the transverse direction. A pair of signal lines and a pair of scanning lines define a pixel area. Each selection transistor (i.e., commonly called switching thin film transistor (TFT)) is disposed in the pixel area near the crossing of the scanning line and signal line and acts as an addressing element that controls the voltage. A storage capacitor $C_{ST}$ is connected to the voltage line and the switching TFT. Each drive transistor (i.e., commonly called driving TFT) is connected to the storage capacitor $C_{ST}$ and the voltage line and acts as a current source element. An organic electroluminescent diode is connected to the drive transistor.

The organic electroluminescent diode had a double-layer structure of organic thin films between an anode electrode and a cathode electrode. The organic thin films and the fabrication technologies have been improved. As a result, organic electroluminescent diodes presently available provide colors in the emitted light. Since the primary three colors have been obtained, research and development have been directed toward providing a full-color organic electroluminescent element.

When the forward current is applied to the organic electroluminescent diode, the electron-hole pair is combined through the P(positive)-N(negative) junction between the anode electrode providing the hole and the cathode electrode providing the electron. The electron-hole pair has a lower energy than when they are separated into the electron and the hole. Therefore, an energy gap occurs between the combination and the separation of electron-hole pairs, and this energy is converted into light by the organic electroluminescent element. That is, the organic electroluminescent layer absorbs the energy generated due to the recombination of electrons and holes when a current flows.

The organic electroluminescent devices are classified into a top emission type and a bottom emission type in accordance with a progressive direction of light emitted from the organic electroluminescent diode. In the bottom emission type device, light is emitted in a direction toward the substrate where the lines and TFTs are disposed. Therefore, the display area decreases because the emitted light is blocked by the lines and TFTs. However, in the top emission type device, since light is emitted in a direction opposite to the substrate, the display area can be 70–80% of the entire panel area.

The top emission type can have a low contrast ratio as compared to the bottom emission type because of the effects of external light reflection. The contrast ratio in the organic electroluminescent device is a luminance ratio when the device is turned on and off. The luminance during the time the device is turned off is determined by the device's reflection ratio to the external light. Therefore, it is important to decrease the device's reflection ratio to external light in order to obtain a high contrast ratio.

FIG. 2 is a partial cross-sectional view showing an example of a top emission type organic electroluminescent display device according to a conventional art. In FIG. 2, an organic electroluminescent display device includes a driving thin film transistor (TFT) T and an organic electroluminescent diode E. A buffer layer 30 is formed on a substrate 1. The driving TFT T includes a semiconductor layer 32 on the buffer layer 30, a gate electrode 38, a source electrode 50 and a drain electrode 52. A power electrode 42 extending from the voltage line is connected to the source electrode 50 and the organic electroluminescent diode E is connected to the drain electrode 52. A capacitor electrode 34 made of the same material as the semiconductor layer 32 is disposed below the power electrode 42. The power electrode 42 corresponds to the capacitor electrode 34 and an insulator is interposed therebetween, thereby forming a storage capacitor $C_{ST}$.

The organic electroluminescent diode E includes an anode electrode 58, a cathode electrode 66 and an organic electroluminescent layer 64 interposed therebetween. The organic electroluminescent device shown in FIG. 2 has a luminous area A where the organic electroluminescent diode E emits light produced therein.

A top passivation layer 68 is formed on the cathode electrode 66 to protect the organic electroluminescent elements from external environmental effects, such as humidity. As a material for the top passivation layer 68, an organic or inorganic material can be used. However, since the organic or inorganic material has a refractive index of more than 1.5, a surface reflectivity of about 4% may result. Therefore, the contrast of the organic electroluminescent device is degraded. Furthermore, the anode electrode 58 of the organic electroluminescent diode E may be made of Au, Ag, Pt, Al or the like which has a high reflectivity, for example, more than about 60%. Thus, the contrast ratio due to external environmental effects is dramatically degraded because of the reflection on the anode electrode 58 made of one of those metallic materials.

Although not shown in FIG. 2, a circularly polarizing plate which controls a phase difference of incident light can be formed on the top passivation layer 68. However, since the circularly polarizing plate is degraded by humidity and high temperature, the lifetime of the products becomes shorter and the product costs increases.

FIG. 3 is a partial cross-sectional view showing another example of a top emission type organic electroluminescent display device according to the conventional art.

As shown in FIG. 3, the organic electroluminescent display device includes a thin film transistor (TFT) T within a luminous area A. The thin film transistor T includes a gate electrode 12, a semiconductor layer 16, and source and drain electrode 18 and 20. An organic electroluminescent diode E connected to the thin film transistor T has a lower electrode 24, an upper electrode 28 and an organic electroluminescent layer 26 interposed therebetween. Here, an insulation layer 27 divides the organic electroluminescent layer 26 into a pixel unit, and the organic electroluminescent layer 26 overlaps the thin film transistor T.

The lower and upper electrodes 24 and 28 of the organic electroluminescent diode E become a cathode and/or an anode, respectively, depending on a carrier type supplied from the thin film transistor T. When an n-type TFT having electrons as carriers is connected to the organic electroluminescent diode E, the lower electrode 24 becomes the cathode and the upper electrode 30 becomes the anode. However, when the p-type TFT having holes as carriers is connected to the organic electroluminescent diode E, the lower electrode 24 becomes the anode and the upper electrode 30 becomes the cathode.

Still in FIG. 3, a buffer layer 29 is formed on the upper electrode 28 and a passivation layer 30 is formed on the buffer layer 29. The buffer layer 29 is an insulation material that can be deposited on the upper electrode 28 by a vacuum evaporation method. Additionally, the buffer layer 29 protects the organic electroluminescent diode E when the passivation layer 30 is formed. As a material for the passivation layer 30, a thick insulation material or a glass plate is usually employed.

However, the organic electroluminescent display device shown in FIG. 3 has a number of problems. For example, because the lower electrode is usually formed of Au, Ag, Pt, Al or the like which has a reflectivity of more than 60%, external light is easily reflected by the lower electrode in high luminance intensity situations. As a result, such a reflection causes reduction in contrast.

SUMMARY OF THE INVENTION

Accordingly, the present invention is directed to an organic electroluminescent device that substantially obviates one or more of the problems due to limitations and disadvantages of the related art.

An object of the present invention is to provide an organic electroluminescent display device that reduces the reflectivity with respect to external light, thereby providing improved contrast and resulting in excellent display quality.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent device comprises a substrate; a first electrode disposed over the substrate, the first electrode causing optical interference of incident light; at least one organic electroluminescent layer disposed on the first electrode; a second electrode disposed on the at least one organic electroluminescent layer, the second electrode including a transparent conductive material; a top passivation layer disposed on the second electrode; and a compensation layer disposed on the top passivation layer, the compensation layer including at least one of an antireflection coating material and an antiglare coating material.

In another aspect, an organic electroluminescent device comprises a substrate; a first electrode disposed over the substrate; a first compensation layer disposed on the first electrode, the first compensation layer including a material having conductive and light-absorptive characteristics; at least one organic electroluminescent layer disposed on the first compensation layer; a second electrode disposed on the at least one organic electroluminescent layer, the second electrode including a transparent conductive material; a top passivation layer disposed on the second electrode; and a compensation layer disposed on the top passivation layer, the compensation layer including at least one of an antireflection coating material and an antiglare coating material.

In another aspect, an organic electroluminescent device comprises a substrate; a first compensation layer disposed over the substrate, the first compensation layer including an organic insulation material having light-absorptive characteristics; a first electrode disposed on the first compensation layer, the first electrode including a first transparent conductive material; at least one organic electroluminescent layer disposed on the first electrode; a second electrode disposed on the at least one organic electroluminescent layer, the second electrode including a second transparent conductive material of a same or different material than the first transparent conductive material; a top passivation layer disposed on the second electrode; and a compensation layer disposed on the top passivation layer, the compensation layer including at least one of an antireflection coating material and an antiglare coating material.

In another aspect, an organic electroluminescent device comprises a substrate; at least one thin film transistor disposed over the substrate; a light-shielding layer disposed over the substrate and the at least one thin film transistor; and an organic electroluminescent diode including a first electrode on the light-shielding layer, a second electrode over the light-shielding layer, and at least one organic electroluminescent layer interposed between the first electrode and the second electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, similar reference numbers will be used throughout the drawings to refer to the same or like parts.

Figure 1:
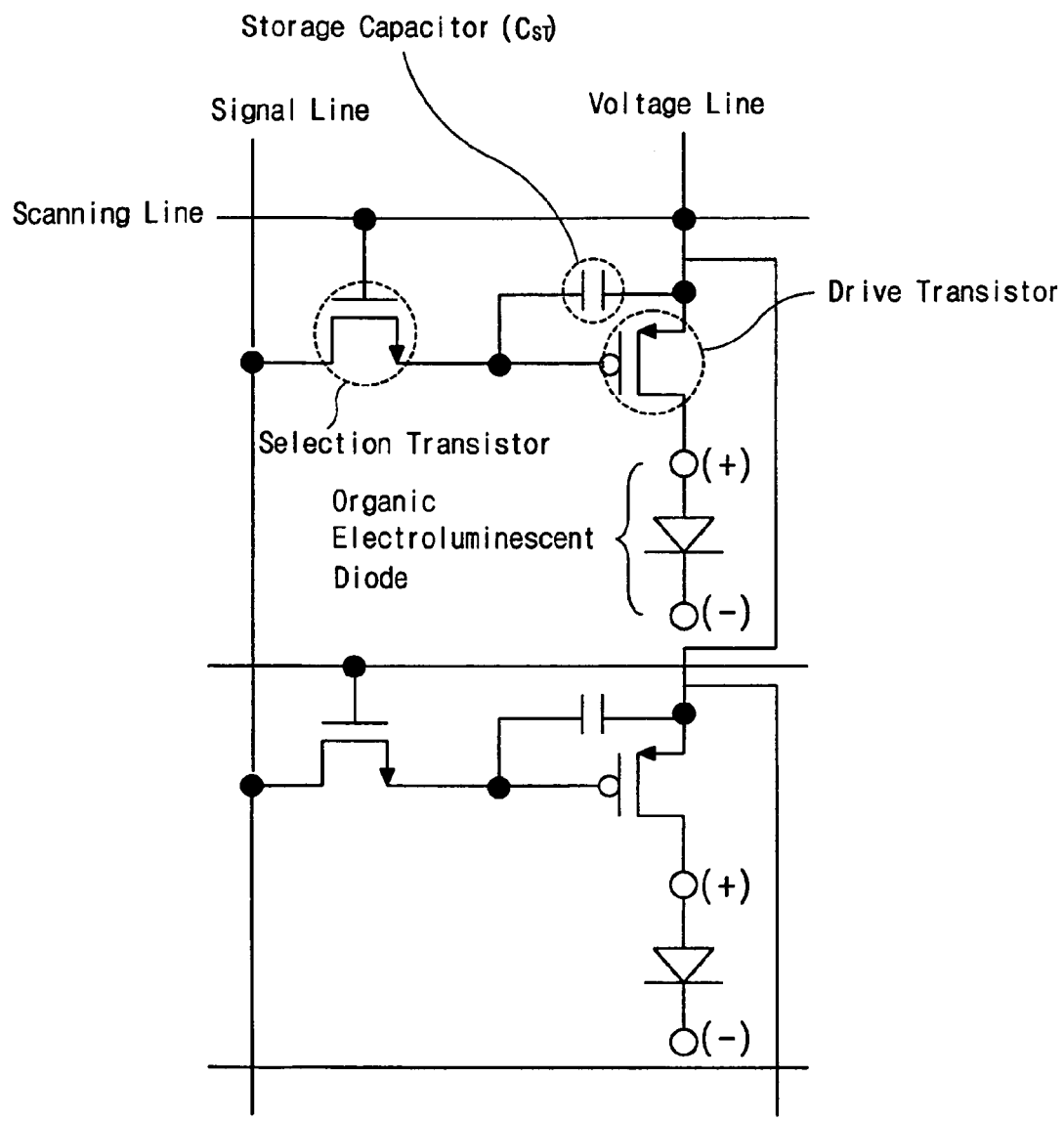
FIG. 1 is an equivalent circuit diagram showing the structural basis of pixels of an active matrix type organic electroluminescent display device.
Figure 2:
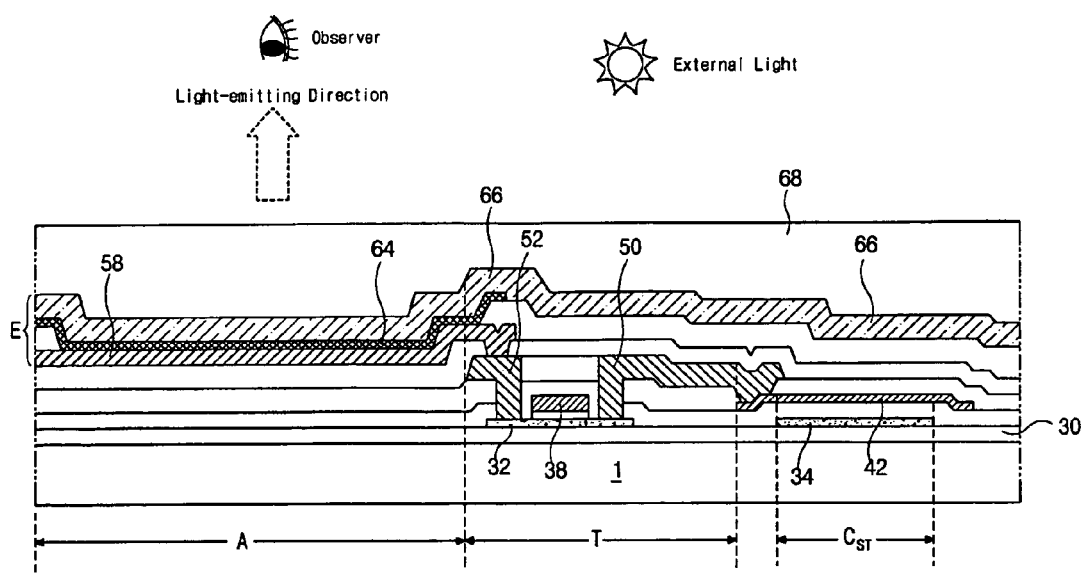
FIG. 2 is a partial cross-sectional view showing an example of a top emission type organic electroluminescent display device according to the related art.
Figure 3:
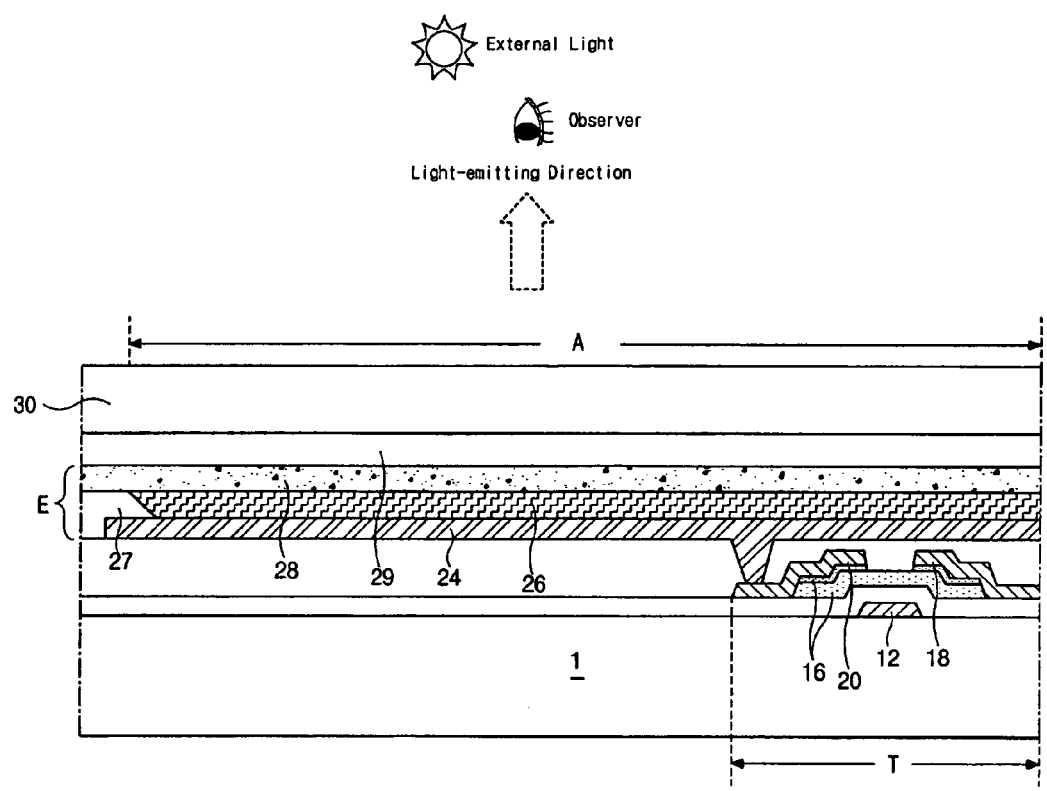
FIG. 3 is a partial cross-sectional view showing another example of a top emission type organic electroluminescent display device according to the related art.
Figure 4:
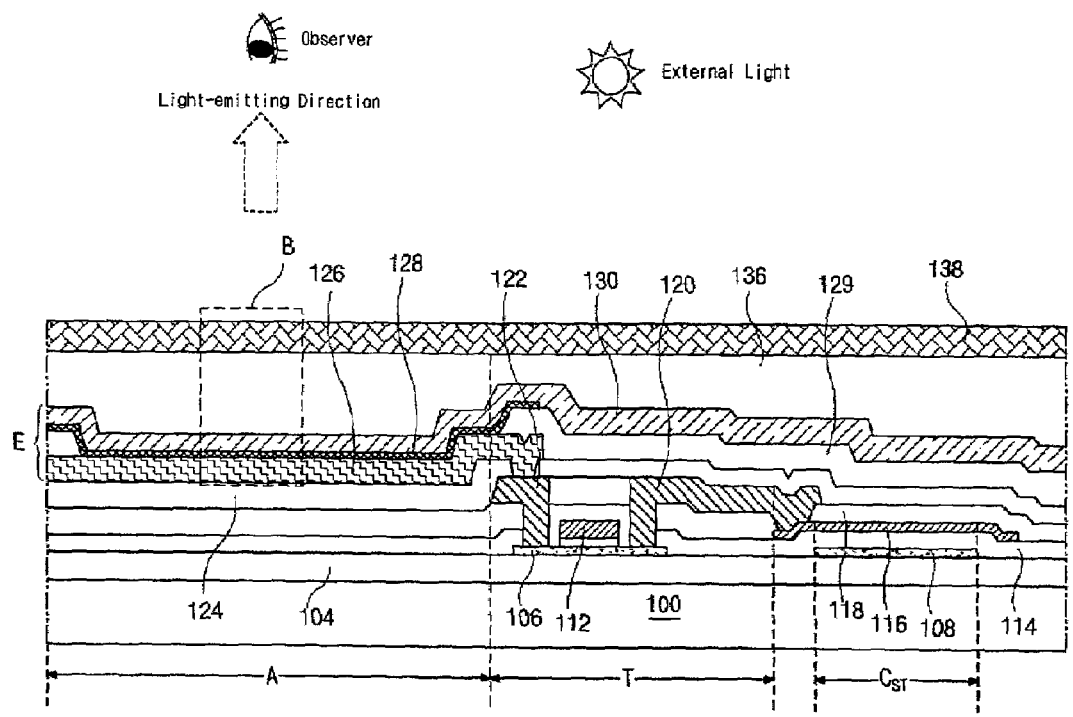
FIG. 4 is a partial cross-sectional view showing an exemplary top emission type organic electroluminescent display device according to a first embodiment of the present invention.

FIG. 4 is a partial cross-sectional view showing a top emission type organic electroluminescent display device according to a first embodiment of the present invention. In FIG. 4, the organic electroluminescent display device according to this embodiment includes a driving thin film transistor (TFT) T and an organic electroluminescent diode E. A buffer layer 104 is formed on a substrate 100. The driving TFT T includes a semiconductor layer 106 on the buffer layer 104, a gate electrode 112 over the semiconductor layer 106, and source/drain electrodes 120 and 122.

A power electrode 116 extending from the voltage line (not shown) is connected to the source electrode 120, and the organic electroluminescent diode E is connected to the drain electrode 122. A capacitor electrode 108 is disposed below the power electrode 116. Thus, the power electrode 116 corresponds to the capacitor electrode 108 and an insulator 114 is interposed therebetween, thereby forming a storage capacitor $C_{ST}$.

The organic electroluminescent diode E includes a first electrode 126, a second electrode 130, and an organic electroluminescent layer 128 interposed therebetween. The organic electroluminescent device shown in FIG. 4 also has a luminous area A from which the organic electroluminescent diode E emits light produced therein.

A top passivation layer 136 is formed on the second electrode 130 to protect the organic electroluminescent elements from external environmental effects, such as humidity. A first compensation layer 138 is disposed on the top passivation layer 136. As a material for the top passivation layer 136, an organic or inorganic material or a material having a good light transmissivity can be utilized. As a material for the first compensation layer 138, a material having low reflection characteristics is preferably used. Such a material for the first compensation layer 138 may be processed by the antireflection coating process or by the antiglare coating process.

When the first compensation layer 138 is made of a material treated through the antireflection coating process, one or more layers constitute the first compensation layer 138. If the first compensation layer 138 is formed of multiple antireflection coating layers, the light interference occurring between each of layers reduces the reflection of the incident light. The plurality of antireflection coating layers are formed by vacuum evaporation, sputtering, chemical vapor deposition (CVD), or other suitable technique.

When the first compensation layer 138 is made of a material treated though the antiglare coating process, silica particles are mixed into a resin. The silica particles immersed in the resin disperse the incident light so that the reflection of the external light decreases. The antiglare coating process may be conducted by spin-coating or other suitable technique.

Figure 5:
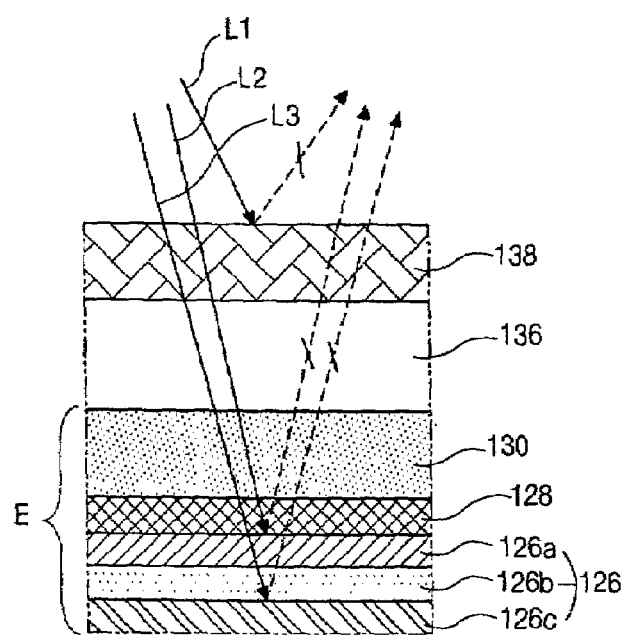
FIG. 5 is an enlarged cross-sectional view of portion B in FIG. 4 illustrating a layer structure and configuration of the first electrode of the organic electroluminescent diode.

FIG. 5 is an enlarged cross-sectional view of portion B of FIG. 4 and illustrates a layer structure and configuration of the first electrode of the organic electroluminescent diode. The first electrode 126 includes a semi-transparent layer 126a, a transparent layer 126b and a reflective layer 126c. The reflective layer 126c is preferably made of Au, Ag, Pt, Al or the like having high reflectivity, and the transparent layer 126b may be made of a transparent conductive layer such as indium tin oxide (ITO) or indium zinc oxide (IZO). Moreover, the semi-transparent layer 126a may be a metallic thin film having semi-transparent characteristics when it is about 100 angstroms or less in thickness. Since the semi-transparent layer 126a is adjacent to the organic electroluminescent layer 128, it is desirable for the semi-transparent layer 126a to have sufficient conductivity for efficient hole injection. Also, it is preferable for the semi-transparent layer 126a to have a work function of small difference from the work function of the organic electroluminescent layer 128.

The traveling direction of the incident light to the organic electroluminescent elements will be explained. When the external light having first portion L1, second portion L2 and third L3 portion [where L1<(L2≈L3)] is incident to the organic electroluminescent elements, the first portion L1 is first scattered or is not reflected by the first compensation layer 138 so that the reflection of the external light is lowered. When the second portion L2 reaches to the organic electroluminescent diode E, the second portion L2 is reflected by the semi-transparent layer 126a. When the third portion L3 passes through both the semi-transparent layer 126a and the transparent layer 126b, the third portion L3 is reflected by the reflective layer 126c. Therefore, light reflected by the semi-transparent layer 126a and the light reflected by the reflective layer 126c destructively interfere with each other. Accordingly, the destructive interference causes an overall reduction in reflectivity.

Meanwhile, for insulation between the elements shown in FIG. 4, there are a first passivation layer 114, a second passivation layer 118, a third passivation layer 124, and a fourth passivation layer 129. The first passivation layer 114 is between the capacitor electrode 108 and the power electrode 116 in the storage capacitor $C_{ST}$. The second passivation layer 118 is disposed between the power electrode 116 and the source electrode 120. The third passivation layer 124 is disposed between the first electrode 126 and the drain electrode 122. The fourth passivation layer 129 is interposed between the thin film transistor T and the organic electroluminescent layer 128. The first to fourth passivation layers each have contact holes to provide electrical connection between the elements. The first to fourth passivation layers 114, 118, 124 and 129 are preferably made of an inorganic insulation material, such as silicon oxide ($SiO_2$) or silicon nitride ($Si_3N_4$). Meanwhile, the second electrode 130 of the organic electroluminescent diode E is a mono layer formed of indium tin oxide (ITO) or indium zinc oxide (IZO), or double layers formed of a thin film metal layer and one of ITO and IZO.

The organic electroluminescent layer 128 disposed between the first electrode 126 and the second electrode 130 is a multi-layered structure that is composed of a hole-injection layer, a hole-transport layer, an emissive layer and an electron-transport layer. Furthermore, in the present invention, the active matrix type organic electroluminescent is preferably manufactured by a vacuum evaporation method.

Figure 6:
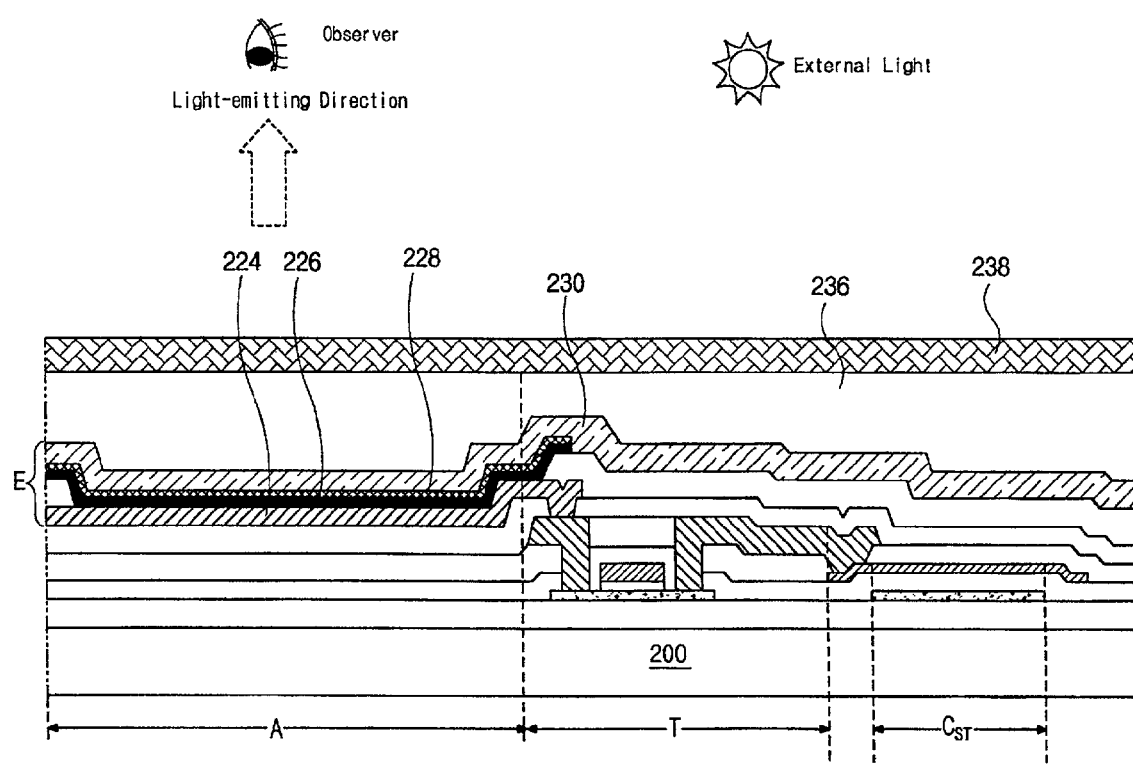
FIG. 6 is a partial cross-sectional view showing another exemplary top emission type organic electroluminescent display device according to a second embodiment of the present invention.

FIG. 6 is a partial cross-sectional view showing a top emission type organic electroluminescent display device according to a second embodiment of the present invention. The organic electroluminescent display device shown in FIG. 6 has almost same structure as the device shown in FIG. 4. However, there are some distinctions from the first embodiment. For example, as shown in FIG. 6, a first compensation layer 238 is disposed on top of the organic electroluminescent display device to decrease the reflection rate of the external light. Additionally, a second compensation layer 226 is formed within the organic electroluminescent diode E. The first compensation layer 238 is made of the same material as the compensation layer 138 of the first embodiment described in FIG. 4. The second compensation layer 226 is interposed between a first electrode 224 and an organic electroluminescent layer 228. The second compensation layer 226 is made of a material having conductive and light-absorptive characteristics. For example, a material including chromium (Cr) is appropriate for the second compensation layer 226.

Figure 7:
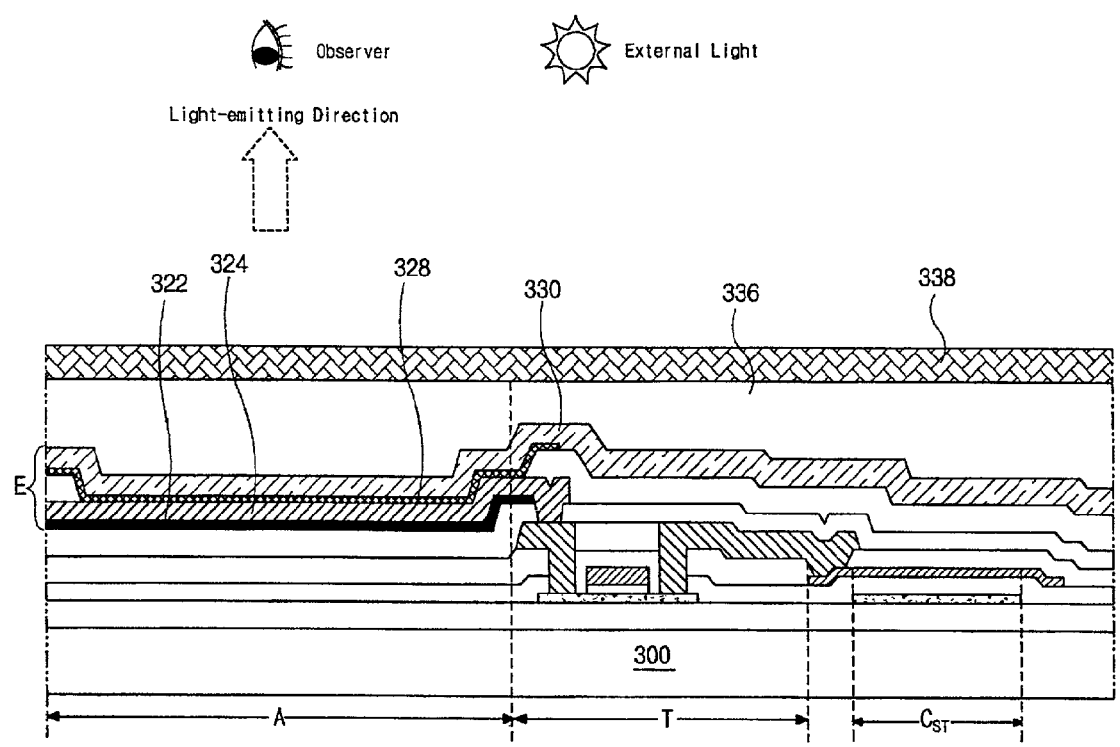
FIG. 7 is a partial cross-sectional view showing another exemplary top emission type organic electroluminescent display device according to a third embodiment of the present invention.

FIG. 7 is a partial cross-sectional view showing a top emission type organic electroluminescent display device according to a third embodiment of the present invention. The organic electroluminescent display device of FIG. 7 is very similar to that of FIG. 6, but the second compensation layer is positioned in a different place.

As shown in FIG. 7, a first compensation layer 338 is disposed on top of the organic electroluminescent display device. The first compensation layer 338 is generally the same as the first compensation layers 138 and 238 shown in FIGS. 4 and 6. Unlike the second embodiment, a second compensation layer 322 is disposed below the first electrode 324 of the organic electroluminescent diode E. The second compensation layer 322 may be substantially made of an organic insulation material, for example, black resin.

Of course, it should be noted that the aforementioned first to third embodiments of the present invention can be adopted to the passive matrix type organic electroluminescent display device. Moreover, the above-mentioned thin film transistor connected to the organic electroluminescent diode includes a p-type or n-type semiconductor layer. When the p-type semiconductor is used for the driving TFT, holes act as carriers. In contrast, electrons act as carriers when the n-type semiconductor is used for the driving TFT. Therefore, if the p-type semiconductor is adopted in the driving TFT T of the present invention, the first electrode of the organic electroluminescent diode is an anode and the second electrode is a cathode. Alternatively, if the n-type semiconductor is adopted in the driving TFT T, the first electrode is a cathode and the second electrode is an anode.

According to the first to third embodiment of the present invention, since the first compensation layer reduces the reflectivity of the top passivation layer and since the second compensation layer reduces the reflectivity of the organic electroluminescent diode, external light is hardly reflected and contrast ratio is greatly improved. Since the compensation layer on the top passivation layer is cheaper than the circularly polarizing plate and has an excellent resistance against the humidity and high temperature, the stability of the organic electroluminescent display device increases and the manufacturing costs decrease.

Figure 8:
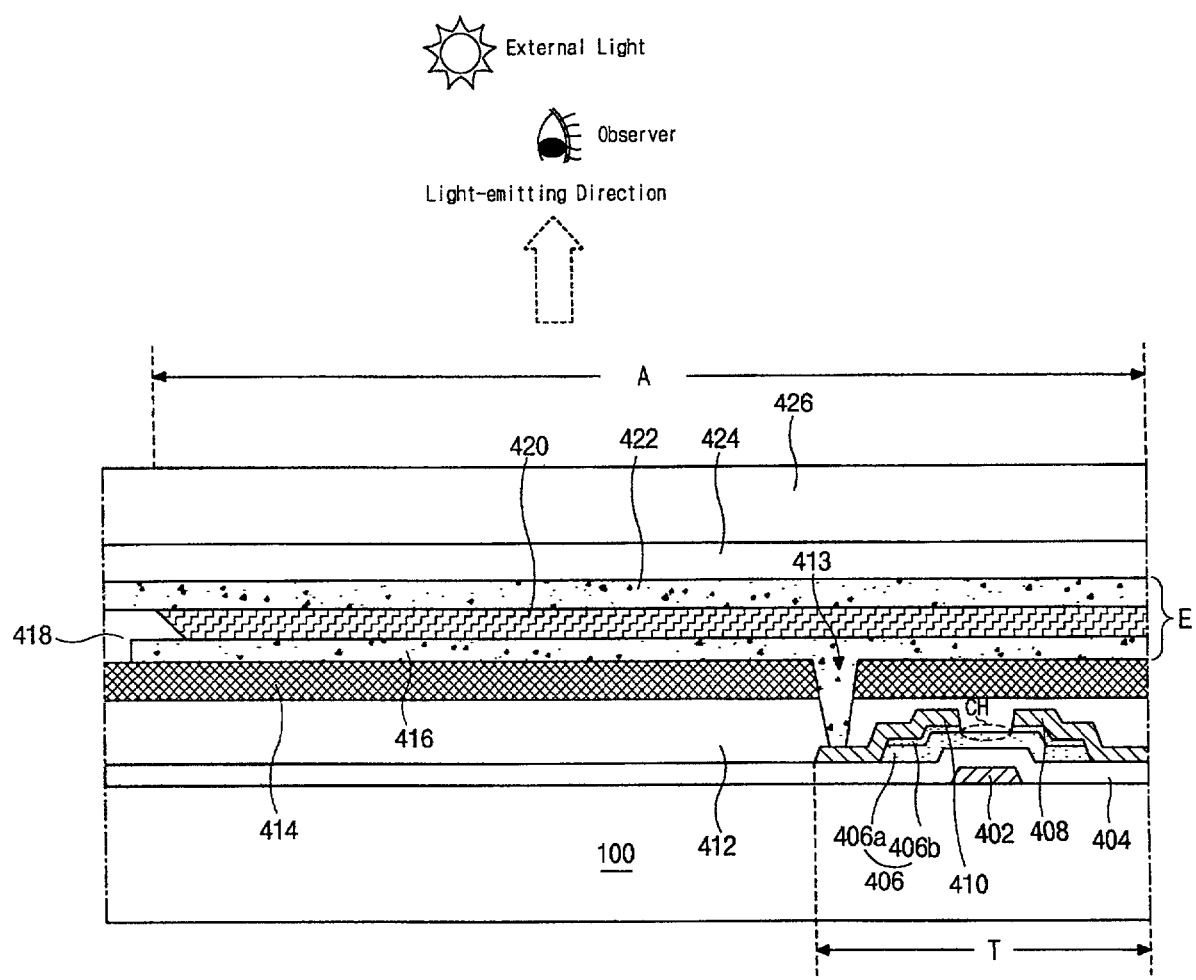
FIG. 8 is a partial cross-sectional view showing a top emission type organic electroluminescent display device according to a fourth embodiment of the present invention.

FIG. 8 is a partial cross-sectional view showing a top emission type organic electroluminescent display device according to a fourth embodiment of the present invention.

In FIG. 8, the organic electroluminescent display device includes a thin film transistor T and an organic electroluminescent diode E. The thin film transistor T includes a gate electrode 402, a gate insulation layer 404, a semiconductor layer 406, a source electrode 408 and a drain electrode 410. The gate electrode 402 is formed on a substrate 100 and the gate insulation layer 404 covers the gate electrode 402. The semiconductor layer 406 is disposed on the gate insulation layer 404 over the gate electrode 402, and sequentially includes an active layer 406a and an ohmic contact layer 406b. On the ohmic contact layer 406b, a source electrode 408 and a drain electrode 410 spaced apart from each other are formed. A portion of the ohmic contact layer 406b between the source and drain electrodes 408 and 410 is removed to form a channel CH in the active layer 406a.

A first passivation layer 412 is formed on the gate insulation layer 404 to cover the thin film transistor T, thereby protecting the thin film transistor T. On the first passivation layer 412, a light-shielding layer 414 and a first electrode 416 are sequentially formed. A drain contact hole 413 is formed though both the first passivation layer 412 and the light-shielding layer 414, and thus, the first electrode 416 contacts the drain electrode 410 through the drain contact hole 413. A second passivation layer 418 is formed on the first electrode 416 and defines an area for the luminous area A. Namely, the second passivation layer 418 formed on the first electrode 416 defines the luminous area A of the organic electroluminescent device by exposing almost the entire first electrode 416. Therefore, an organic electroluminescent layer 420 is formed in the luminous area A. A second electrode 422 is disposed on the organic electroluminescent layer 420, and a buffer layer 424 is formed on the second electrode 422. The top passivation layer 426 is disposed on top of the aforementioned organic electroluminescent display device. The buffer layer 424 is an insulation material that can be deposited on the second electrode 422 by a vacuum evaporation method. Additionally, the buffer layer 424 protects the organic electroluminescent diode E during the time the passivation layer 426 is formed. As a material for the passivation layer 426, a thick insulation material or a glass plate is usually employed.

In the above-mentioned organic electroluminescent display device, a transparent conductive material such as indium tin oxide (ITO) is used for both the first and second electrodes 416 and 422. As mentioned before, when the p-type semiconductor layer is used for the thin film transistor T, the first electrode 416 is the anode that provides holes as carriers. However, when the n-type semiconductor layer is used for the thin film transistor T, the first electrode 416 is the cathode that provides electrons as carriers. Here, the material of the first electrode 416 should have a work function of small difference from that of the organic electroluminescent layer 420. Namely, the first electrode 416 has to have a small work function difference from the organic electroluminescent layer 420. Furthermore, the second electrode 422 is also selected from a material that has a small work function difference from the material for the electroluminescent layer 420.

According to the fourth embodiment of the present invention, since the first electrode 416 is made of a transparent conductive material, the light-shielding layer 414 is formed below the first electrode 416 in order to prevent light leakage in the downward direction. The light-shielding layer 414 protects the channel CH from the light that is emitted from the organic electroluminescent diode as well as external light. Therefore, the material of the light-shielding layer 414 preferably can absorb or reflect as much ultraviolet, visible and/or infrared radiation as possible. Therefore, a polymeric material having light absorptive characteristics such as black resin is preferred. Moreover, the light-shielding layer 414 acts as a planar layer that planarizes the surface of the substrate 100 having the thin film transistor T. The light-shielding layer 414 also acts an insulator that electrically isolates the thin film transistor T from the organic electroluminescent diode E.

The aforementioned fourth embodiment of the present invention can be adopted to the passive matrix type organic electroluminescent display device. Although the thin film transistor shown in FIG. 8 is an inverted staggered type that includes an amorphous silicon, a coplanar type thin film transistor made of polycrystalline silicon can be employed in the organic electroluminescent display device of the fourth embodiment. Additionally, the element layers shown in FIG. 8 are preferably formed by a vacuum evaporation process.

Figure 9:
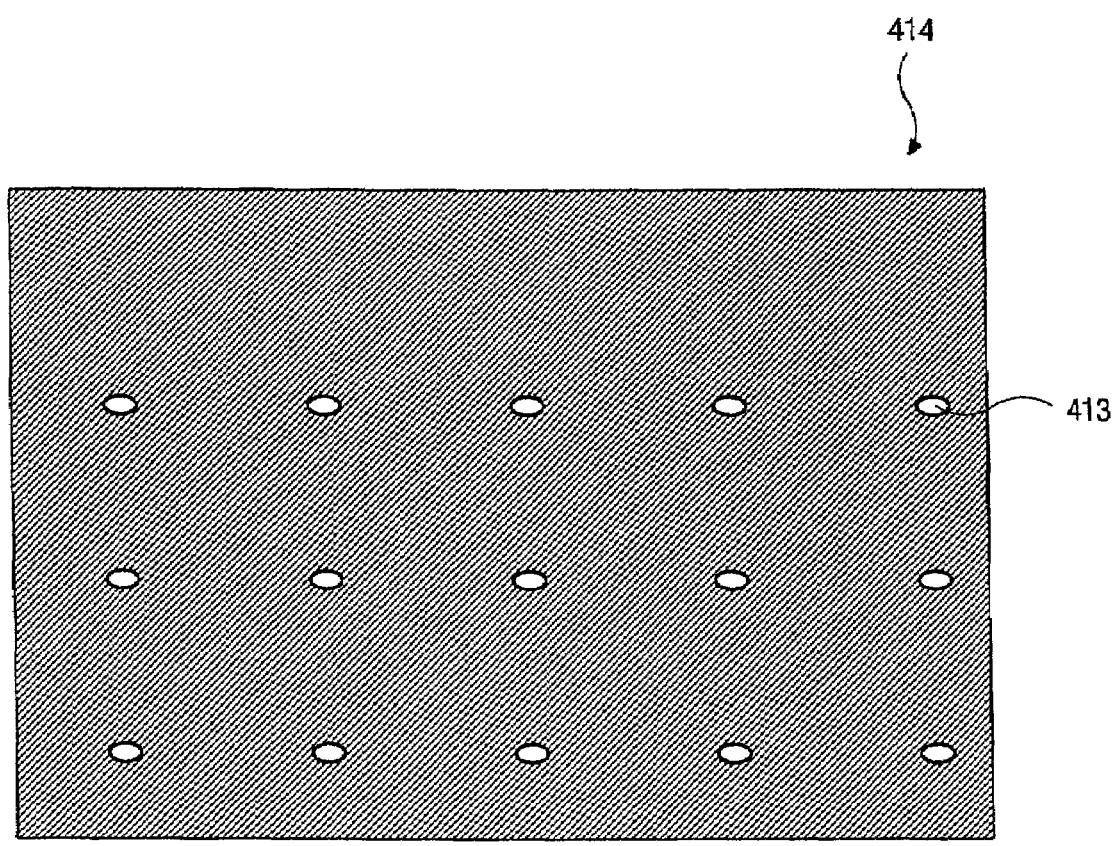
FIG. 9 is a plan view of the light-shielding layer of FIG. 8.

FIG. 9 is a plan view of the light-shielding layer 414 of FIG. 8. The light-shielding layer 414 is large enough in size to cover the whole surface of the substrate, thereby preventing light from passing through the substrate. A plurality of contact holes 413 each corresponding to a drain electrode are formed in the light-shielding layer 414.

Figure 10:
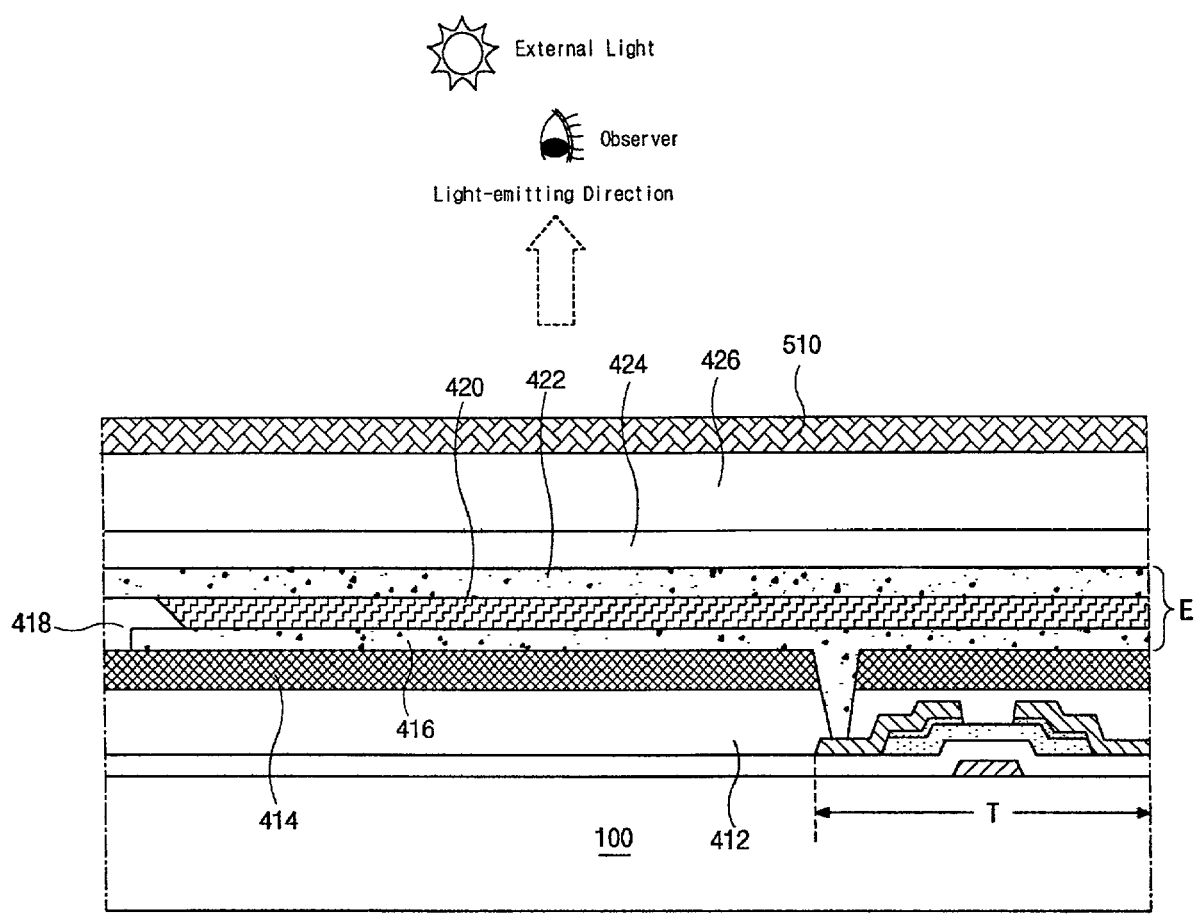
FIG. 10 is a partial cross-sectional view showing another exemplary top emission type organic electroluminescent display device according to a fifth embodiment of the present invention.

FIG. 10 is a partial cross-sectional view showing a top emission type organic electroluminescent display device according to a fifth embodiment of the present invention. Since the organic electroluminescent display device is similar to that shown in FIG. 8, explanations of the similar parts are omitted hereinafter. The organic electroluminescent display device of the fifth embodiment includes a thin film transistor T and an organic electroluminescent diode that are similar as those shown in FIG. 8. However, the organic electroluminescent display device shown in FIG. 10 further includes a compensation layer 510 on the top passivation layer 426.

The compensation layer 510 is made of an antireflection coating material or an antiglare coating material. Namely, as a material for the compensation layer 510, a material that has low reflection characteristics is substantially used. Such a material for the compensation layer 510 is processed by the antireflection coating process or by the antiglare coating process.

When the compensation layer 510 is made of the material which is treated through the antireflection coating process, one or plural layers constitute the compensation layer 510. If the compensation layer 510 is formed of the plural antireflection coating layers, the light interference occurring between each layer reduces the reflection of the incident light. The plurality of antireflection coating layers are formed by vacuum evaporation, sputtering, chemical vapor deposition (CVD), or other suitable technique.

When the compensation layer 510 is made of a material treated though the antiglare coating process, silica particles are mixed into a resin. The silica particles immersed in the resin disperse the incident light such that the reflection of the external light decreases. The antiglare coating process may be conducted by spin-coating or other suitable technique.

According to the fifth embodiment of the present invention, since the compensation layer 510 decreases the reflection of the external light on the surface of the substrate, the contrast ratio does not decrease. Since the light-shielding layer prevents the light from reaching to the thin film transistor, the photo current occurring in the channel is prevented.

It will be apparent to those skilled in the art that various modifications and variation can be made in the organic electroluminescent device of the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
   a substrate;
   a first electrode disposed over the substrate, the first electrode causing optical interference of incident light;
   at least one organic electroluminescent layer disposed on the first electrode;
   a second electrode disposed on the at least one organic electroluminescent layer, the second electrode including a transparent conductive material;
   a top passivation layer disposed on the second electrode; and
   a compensation layer disposed on the top passivation layer, the compensation layer including at least one of an antireflection coating material and an antiglare coating material.

2. The device according to claim 1, wherein the transparent conductive material of the second electrode includes at least one of indium tin oxide (ITO) and indium zinc oxide (IZO).

3. The device according to claim 2, wherein the second electrode has a mono-layered structure of one of indium tin oxide (ITO) and indium zinc oxide (IZO).

4. The device according to claim 2, wherein the second electrode has a double-layered structure including a thin film metal and one of indium tin oxide (ITO) and indium zinc oxide (IZO).

5. The device according to claim 1, wherein the compensation layer includes the antireflection coating material, the antireflection coating material being formed by one of vacuum evaporation, sputtering, and chemical vapor deposition (CVD).

6. The device according to claim 1, wherein the compensation layer includes the antiglare coating material, the antiglare coating material being formed by a spin-coating method of a mixture of silica particles and a resin.

7. The device according to claim 1, further comprising at least one thin film transistor.

8. The device according to claim 7, wherein the at least one thin film transistor includes a p-type transistor, and wherein the first electrode acts as an anode and the second electrode acts as a cathode.

9. The device according to claim 1, wherein the first electrode includes a semi-transparent layer, a transparent layer, and a reflective layer.

10. The device according to claim 9, wherein a work function of the semi-transparent layer has a small difference from a work function of the at least one organic electroluminescent layer.

11. An organic electroluminescent device, comprising:
    a substrate;
    a first electrode disposed over the substrate;
    a first compensation layer disposed on the first electrode, the first compensation layer including a material having conductive and light-absorptive characteristics;
    at least one organic electroluminescent layer disposed on the first compensation layer;
    a second electrode disposed on the at least one organic electroluminescent layer, the second electrode including a transparent conductive material;
    a top passivation layer disposed on the second electrode; and
    a second compensation layer disposed on the top passivation layer, the second compensation layer including at least one of an antireflection coating material and an antiglare coating material.

12. The device according to claim 11, wherein the transparent conductive material of the second electrode includes at least one of indium tin oxide (ITO) and indium zinc oxide (IZO).

13. The device according to claim 12, wherein the second electrode has a mono-layered structure of one of indium tin oxide (ITO) and indium zinc oxide (IZO).

14. The device according to claim 12, wherein the second electrode has a double-layered structure including a thin film metal and one of indium tin oxide (ITO) and indium zinc oxide (IZO).

15. The device according to claim 11, wherein the second compensation layer includes the antireflection coating material, the antireflection coating material being formed by one of vacuum evaporation, sputtering, and chemical vapor deposition (CVD).

16. The device according to claim 11, wherein the second compensation layer includes the antiglare coating material, the antiglare coating material being formed by a spin-coating method of a mixture of silica particles and a resin.

17. The device according to claim 11, further comprising at least one thin film transistor.

18. The device according to claim 17, wherein the at least one thin film transistor includes a p-type transistor, and wherein the first electrode acts as an anode and the second electrode acts as a cathode.

19. The device according to claim 11, wherein the first compensation layer includes chromium (Cr).

20. An organic electroluminescent device, comprising:
    a substrate;
    a first compensation layer disposed over the substrate, the first compensation layer including an organic insulation material having light-absorptive characteristics;
    a first electrode disposed on the first compensation layer, the first electrode including a first transparent conductive material;
    at least one organic electroluminescent layer disposed on the first electrode, the at least one organic electroluminescent layer defining a luminous region;
    a second electrode disposed on the at least one organic electroluminescent layer, the second electrode including a second transparent conductive material of a same or different material than the first transparent conductive material;
    a top passivation layer disposed on the second electrode; and
    a second compensation layer disposed on the top passivation layer, the second compensation layer including at least one of an antireflection coating material and an antiglare coating material, wherein substantially an entire lower surface of the first electrode contacting the first compensation layer, and wherein the first compensation layer is disposed substantially only in the luminous region.

21. The device according to claim 20, wherein the transparent conductive material of the second electrode includes at least one of indium tin oxide (ITO) and indium zinc oxide (IZO).

22. The device according to claim 21, wherein the second electrode has a mono-layered structure of one of indium tin oxide (ITO) and indium zinc oxide (IZO).

23. The device according to claim 21, wherein the second electrode has a double-layered structure including a thin film metal and one of indium tin oxide (ITO) and indium zinc oxide (IZO).

24. The device according to claim 20, wherein the second compensation layer includes the antireflection coating material, the antireflection coating material being formed by one of vacuum evaporation, sputtering, and chemical vapor deposition (CVD).

25. The device according to claim 20, wherein the second compensation layer includes the antiglare coating material, the antiglare coating material being formed by a spin-coating method of a mixture of silica particles and a resin.

26. The device according to claim 20, further comprising at least one thin film transistor.

27. The device according to claim 26, wherein the at least one thin film transistor includes a p-type transistor, and wherein the first electrode acts as an anode and the second electrode acts as a cathode.

28. The device according to claim 20, wherein the first compensation layer includes a black resin.

* * * * *